United States Patent
Chen et al.

(10) Patent No.: US 8,513,532 B2
(45) Date of Patent: Aug. 20, 2013

(54) FLEXIBLE CIRCUIT STRUCTURE WITH STRETCHABILITY AND METHOD OF MANUFACTURING THE SAME

(75) Inventors: Yu-Hua Chen, Hsinchu (TW); Ying-Ching Shih, Hsinchu (TW)

(73) Assignee: Industrial Technology Research Institute, Chu-Tung, Hisinchu (TW)

( * ) Notice: Subject to any disclaimer, the term of this patent is extended or adjusted under 35 U.S.C. 154(b) by 129 days.

(21) Appl. No.: 13/033,385

(22) Filed: Feb. 23, 2011

(65) Prior Publication Data

US 2012/0043115 A1 Feb. 23, 2012

Related U.S. Application Data

(62) Division of application No. 11/770,878, filed on Jun. 29, 2007, now abandoned.

(30) Foreign Application Priority Data

Apr. 18, 2007 (TW) ................................ 96113690 A

(51) Int. Cl.
*H05K 1/00* (2006.01)

(52) U.S. Cl.
USPC ........................... 174/254; 174/255; 174/267

(58) Field of Classification Search
None
See application file for complete search history.

(56) References Cited

U.S. PATENT DOCUMENTS

| | | | |
|---|---|---|---|
| 5,681,662 A * | 10/1997 | Chen et al. | 428/607 |
| 5,790,377 A | 8/1998 | Schreiber et al. | |
| 5,924,193 A | 7/1999 | Crumly et al. | |
| 5,956,235 A | 9/1999 | Kresge et al. | |
| 6,166,333 A | 12/2000 | Crumly et al. | |
| 6,177,728 B1 | 1/2001 | Susko et al. | |
| 6,333,555 B1 | 12/2001 | Farnworth et al. | |
| 6,441,500 B1 | 8/2002 | Sumikawa et al. | |
| 6,743,982 B2 | 6/2004 | Biegelsen et al. | |
| 6,848,176 B2 | 2/2005 | Hishinuma | |
| 7,220,920 B1 * | 5/2007 | Webb, Jr. | 174/254 |
| 7,265,298 B2 * | 9/2007 | Maghribi et al. | 174/254 |
| 7,337,012 B2 * | 2/2008 | Maghribi et al. | 607/152 |
| 7,380,338 B2 | 6/2008 | Lee | |
| 2004/0192082 A1 | 9/2004 | Wagner et al. | |
| 2004/0238819 A1 | 12/2004 | Maghribi et al. | |
| 2004/0243204 A1 | 12/2004 | Maghribi et al. | |

FOREIGN PATENT DOCUMENTS

| | | |
|---|---|---|
| TW | 1237533 | 8/2005 |
| TW | 096113690 | 8/2010 |

OTHER PUBLICATIONS

U.S. Appl. No. 11/770,878, mail date Sep. 17, 2008, Restriction Requirement.
U.S. Appl. No. 11/770,878, mail date Nov. 12, 2008, Office Action.
U.S. Appl. No. 11/770,878, mail date May 29, 2009, Final Office Action.
U.S. Appl. No. 11/770,878, mail date Apr. 13, 2010, Office Action.
U.S. Appl. No. 11/770,878, mail date Nov. 16, 2010, Office Action.

* cited by examiner

*Primary Examiner* — Ishwarbhai Patel
(74) *Attorney, Agent, or Firm* — Workman Nydegger

(57) ABSTRACT

A flexible circuit structure with stretchability comprises a flexible substrate, a metal layer, and a plurality of flexible bumps. The metal layer is formed on the flexible substrate. These flexible bumps are formed on the metal layer and the flexible substrate.

4 Claims, 11 Drawing Sheets

FLEXIBLE CIRCUIT STRUCTURE WITH STRETCHABILITY AND METHOD OF MANUFACTURING THE SAME

CROSS-REFERENCE TO RELATED APPLICATIONS

This application is a divisional of U.S. application Ser. No. 11/770,878 (the "'878 application"), filed Jun. 29, 2007 now abandoned; the '878 application, in turn, claims priority under 35 U.S.C. §119(a) to Taiwanese patent application No. 096113690 filed in Taiwan, R.O.C. on Apr. 18, 2007. The entire disclosures of both of the aforementioned applications are incorporated herein in their respective entireties by this reference.

BACKGROUND OF THE INVENTION

1. Field of the Invention

The present invention relates to a flexible circuit structure and a method of manufacturing the same, and more particularly to a flexible circuit structure with stretchability and a method of manufacturing the same.

2. Related Art

Due to the developing trend of the electronics to become light, thin, short, and small and flexible, printed circuit boards (PCBs) that cannot be bent have gradually been replaced by highly-plastic flexible printed circuits (FPCs) boards, e.g., E-papers or flexible displays. In the applications of the FPC boards, the circuits must have specially-designed structures or made of special materials to withstand an external tensile force, so as to enhance the reliability in use.

In U.S. Pat. No. 6,743,982, a circuit is manufactured on a removable dielectric substrate. The circuit is formed by depositing two different metal materials. Then, the dielectric substrate under the circuit is removed. Thus, a coiled circuit structure is formed through deformation caused by different stress gradients of the metals, so as to achieve an overall stretchable effect.

In US Patent Publication No. US20040192082, a metal circuit is deposited on a pre-stretched flexible substrate. Then, the flexible substrate is released, so as to form a wave-shaped metal circuit structure. Upon being stretched by an external force in a specific direction, the wave-shaped metal circuit structure will be deformed accordingly, so as to prevent a break circuit from occurring to the metal circuit.

In both US Patent Publication No. US20040238819 and US Patent Publication No. US20040243204, a wave-shaped or saw tooth-shaped metal circuit is deposited on a flexible substrate, such that the stretchability of the metal circuit in the longitudinal or transverse direction is improved due to the deformation of the metal circuit. In the US Patent Publication No. US20040238819, the flexible substrate is firstly etched into a wave-shaped structure in a vertical direction, and then, the metal circuit is deposited on the wave-shaped flexible substrate, so as to improve the stretchability of the metal circuit.

According to the above methods, in most cases, the structural shape or material of the circuit is changed to enable the circuit to have better stretchability. However, the external stresses are mainly withstood by the circuit structure directly, so that the stretchability of the circuit structure is limited. Moreover, as an etching process is applied in most circuit process, if the width of the circuit is too small, the etching process becomes quite difficult to be achieved. Therefore, it is still an important trend for persons of this field to improve the stretchability of the circuit and to provide more convenient manufacturing methods.

SUMMARY OF THE INVENTION

Accordingly, the present invention is mainly directed to a flexible circuit structure with stretchability and a method of manufacturing the same. By supporting a circuit with island-shaped flexible bumps, when a flexible substrate is deformed under an external force, the circuit has better stretchability due to the supporting of the island structure together with a curved structure of the circuit, and thus, the stretchability of the flexible circuit is improved. Moreover, through using a method of circuit implantation, the flexible circuit can be manufactured more conveniently.

The present invention provides a flexible circuit structure with stretchability, which includes: a flexible substrate, a plurality of flexible bumps formed on the flexible substrate as independent structures or as an integrated structure, a metal layer formed on the flexible bumps and the flexible substrate, and a flexible material layer disposed on the metal layer.

Moreover, the present invention further provides a method of manufacturing a flexible circuit with stretchability, which includes: providing a supporting substrate; providing a flexible substrate on the supporting substrate; forming a plurality of flexible bumps on the flexible substrate; forming a metal layer on the flexible substrate and the flexible bumps; and forming a flexible material layer on the metal layer.

Through the flexible circuit structure with stretchability and the method of manufacturing the same, when the flexible substrate bears an external tensile force and is deformed, the flexible bumps on the flexible substrate are meanwhile compressed in a vertical direction, so that the flexible substrate is deformed in a horizontal direction. Therefore, the circuit above the flexible bumps only changes from a 3D circuit into the one in the same plane, but the break circuit will not occur though there is an external stretch. Thus, the flexible circuit has better stretchability, and the flexible circuit can be manufactured more conveniently through circuit implantation.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only, which thus is not limitative of the present invention, and wherein.

DETAILED DESCRIPTION OF THE INVENTION

Figure 1A:
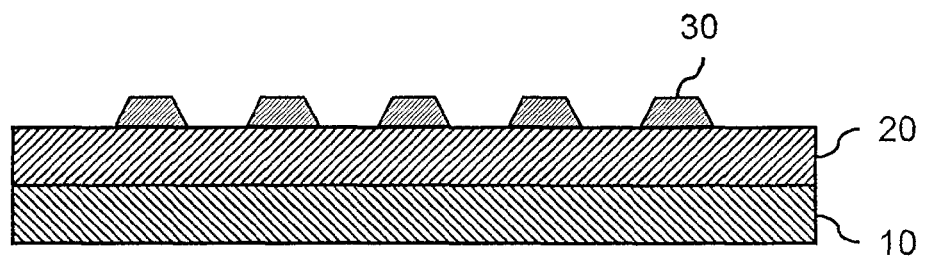
FIG. 1A is a schematic sectional view of a flexible circuit structure according to a first embodiment of the present invention.
Figure 1B:
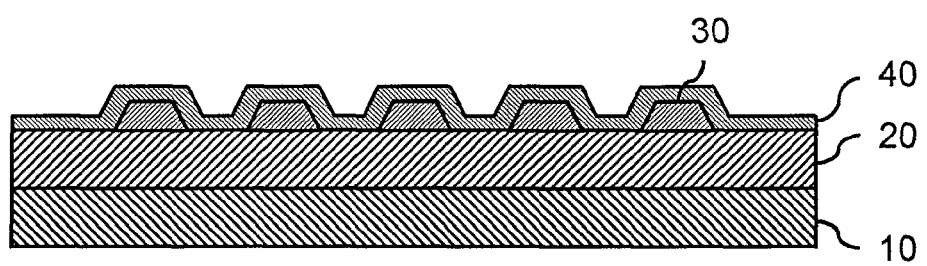
FIG. 1B is a schematic sectional view of the flexible circuit structure according to the first embodiment of the present invention.
Figure 1C:
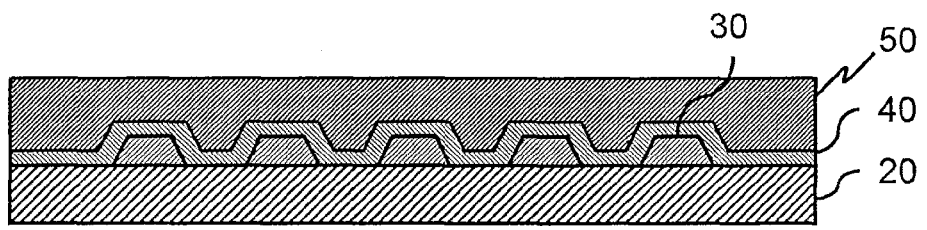
FIG. 1C is a schematic sectional view of the flexible circuit structure according to the first embodiment of the present invention.

FIGS. 1A, 1B, and 1C are respectively schematic sectional views of a flexible circuit structure according to a first embodiment of the present invention. As shown in FIG. 1C, the flexible circuit structure with stretchability of the present invention includes a flexible substrate 20, a plurality of flexible bumps 30, a metal layer 40, and a flexible material layer 50.

Firstly, as shown in FIG. 1A, in the flexible circuit structure with stretchability of the present invention, the flexible substrate 20 is attached on a supporting substrate 10 through a thermal release manner or a UV release manner. The material of the flexible substrate 20 includes polyimide (PI) or polydimethylsiloxane (PDMS). Then, a plurality of compressible flexible bumps 30 is deposited on the flexible substrate 20 at predetermined positions for implanting the metal circuit, and the compressibility of the flexible bumps 30 is higher than that of the flexible substrate 20. The material of the flexible bumps 30 includes polyimide (PI), polydimethylsiloxane (PDMS), or polyurethane (PU). The flexible bumps 30 are in a substantially island-shaped structure, and persons skilled in the art can easily understand that the flexible bumps 30 can also be designed into triangular, semicircular, wave-shaped, or another geometrical shape.

Referring to FIG. 1B, after the flexible bumps 30 has been deposited, the metal circuit is implanted on the flexible substrate 20 and the flexible bumps 30, so as to form the metal layer 40, which is used for transmitting signals. Next, referring to FIG. 1C, a layer of flexible material is covered or laminated onto the metal layer 40, so as to form the flexible material layer 50, and thus, the stability of the flexible circuit structure is improved. Then, the supporting substrate 10 below the flexible substrate 20 is removed. The material of the flexible material layer 50 includes polyimide (PI) or polydimethylsiloxane (PDMS).

Figure 2A:
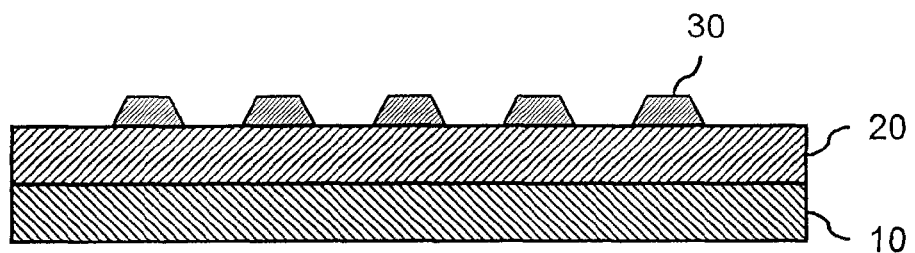
FIG. 2A is a schematic sectional view of a flexible circuit structure according to a second embodiment of the present invention.
Figure 2B:
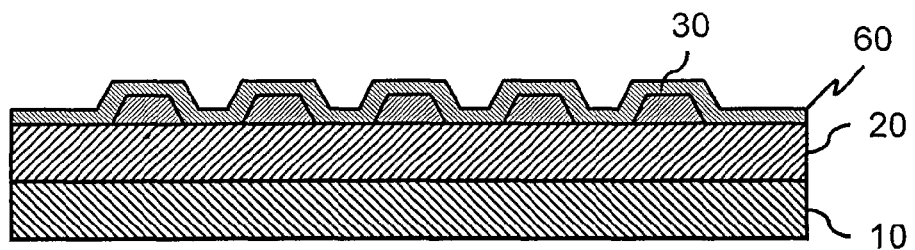
FIG. 2B is a schematic sectional view of the flexible circuit structure according to the second embodiment of the present invention.
Figure 2C:
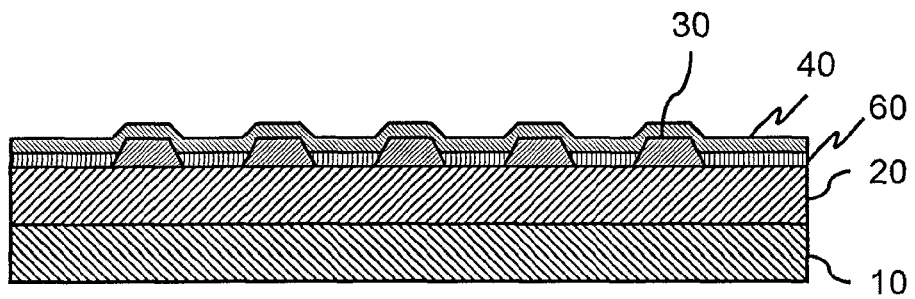
FIG. 2C is a schematic sectional view of the flexible circuit structure according to the second embodiment of the present invention.
Figure 2D:
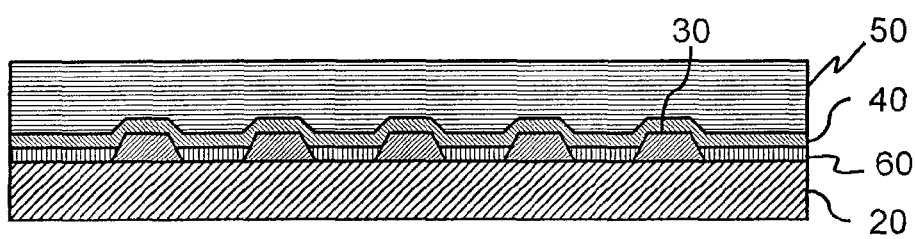
FIG. 2D is a schematic sectional view of the flexible circuit structure according to the second embodiment of the present invention.

FIGS. 2A, 2B, 2C, and 2D are respectively schematic sectional views of a flexible circuit structure according to a second embodiment of the present invention. As shown in FIG. 2D, the flexible circuit structure with stretchability of the present invention includes a flexible substrate 20, a plurality of flexible bumps 30, a metal layer 40, a flexible material layer 50, and a buffer layer 60.

Firstly, as shown in FIG. 2A, in the flexible circuit structure with stretchability of the present invention, the flexible substrate 20 is attached on a supporting substrate 10 through the thermal release manner or the UV release manner. The material of the flexible substrate 20 includes polyimide (PI) or polydimethylsiloxane (PDMS). Then, a plurality of compressible flexible bumps 30 is deposited on the flexible substrate 20 at predetermined positions for implanting the metal circuit, and the compressibility of the flexible bumps 30 is higher than that of the flexible substrate 20. The material of the flexible bumps 30 includes polyimide (PI), polydimethylsiloxane (PDMS), or polyurethane (PU). The flexible bumps 30 are in a substantially island-shaped structure, and persons skilled in the art can easily understand that the flexible bumps 30 can also be designed into triangular, semicircular, wave-shaped, or another geometrical shape.

Referring to FIG. 2B, after the flexible bumps 30 has been deposited, a material with a low adherence is coated on the surfaces of the flexible substrate 20 and the flexible bumps 30, so as to form the buffer layer 60. Next, referring to FIG. 2C, the buffer layer 60 above the flexible bumps 30 is removed, and a metal circuit is implanted above the buffer layer 60 and the flexible bumps 30, so as to form a metal layer 40, which is used for transmitting signals. Next, referring to FIG. 2D, a layer of flexible material is covered or laminated onto the metal layer 40, so as to form the flexible material layer 50, and thus, the stability of the flexible circuit structure is improved. Then, the supporting substrate 10 below the flexible substrate 20 is removed. The material of the flexible material layer 50 includes polyimide (PI) or polydimethylsiloxane (PDMS).

Figure 3A:
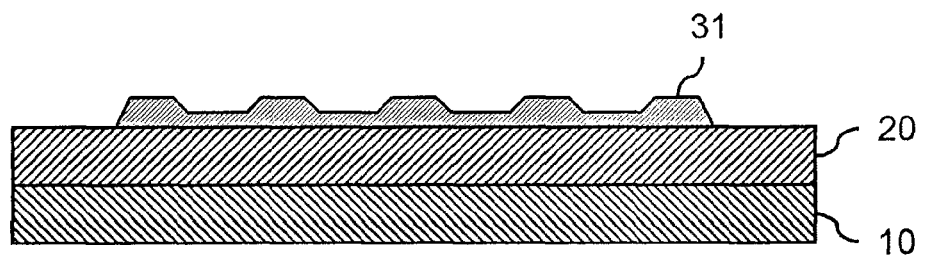
FIG. 3A is a schematic sectional view of a flexible circuit structure according to a third embodiment of the present invention.
Figure 3B:
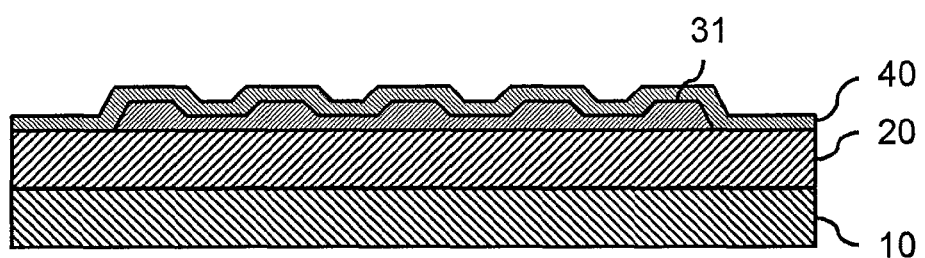
FIG. 3B is a schematic sectional view of the flexible circuit structure according to the third embodiment of the present invention.
Figure 3C:
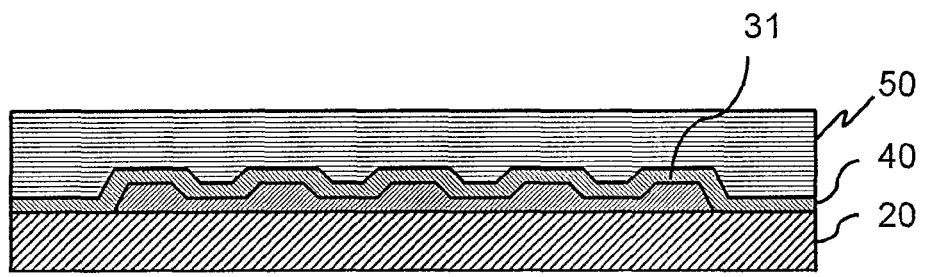
FIG. 3C is a schematic sectional view of the flexible circuit structure according to the third embodiment of the present invention.

FIGS. 3A, 3B, and 3C are respectively schematic sectional views of a flexible circuit structure according to a third embodiment of the present invention. The difference between the third embodiment and the first embodiment lies in that the flexible bumps 31 are interconnected, i.e., the flexible bumps 31 are of an integrated structure. Other structures, materials, and manufacturing processes of the third embodiment are the same as those of the first embodiment, and are not described again herein. In addition, persons skilled in the art can readily understand that the flexible bumps 30 of the second embodiment can also be designed to have the same structure as the flexible bumps 31 of the third embodiment do.

Figure 4A:
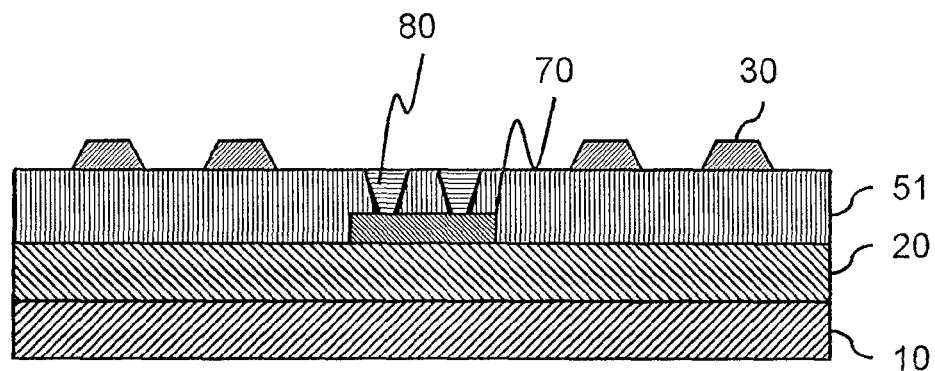
FIG. 4A is a schematic sectional view of a flexible circuit structure according to a fourth embodiment of the present invention.
Figure 4B:
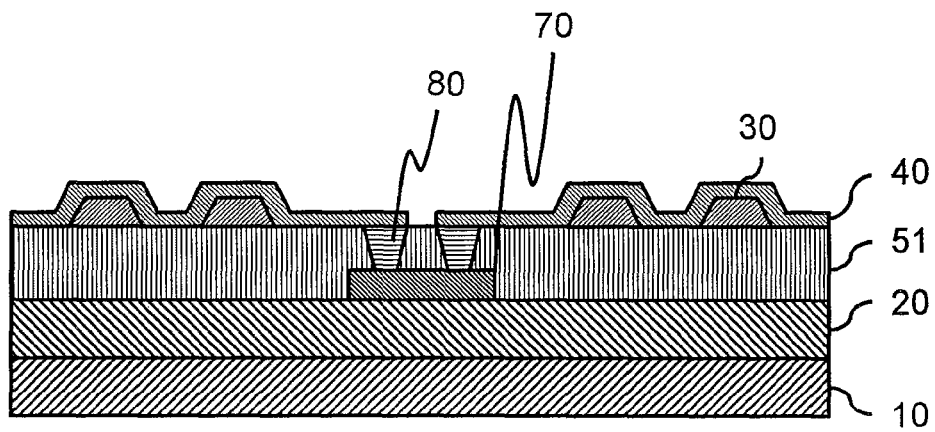
FIG. 4B is a schematic sectional view of the flexible circuit structure according to the fourth embodiment of the present invention.
Figure 4C:
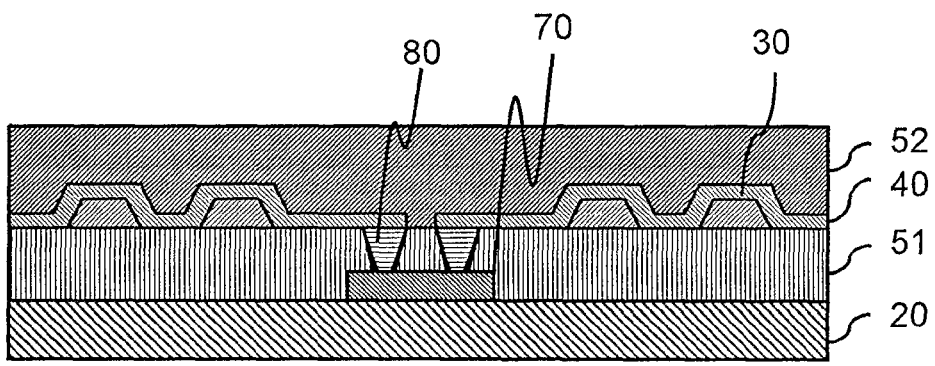
FIG. 4C is a schematic sectional view of the flexible circuit structure according to the fourth embodiment of the present invention.

FIGS. 4A, 4B, and 4C are respectively schematic sectional views of a flexible circuit structure according to a fourth embodiment of the present invention. As shown in FIG. 4C, the flexible circuit structure with stretchability of the present invention includes a flexible substrate 20, a plurality of flexible bumps 30, a metal layer 40, a first flexible material layer 51, a second flexible material layer 52, an active element 70, and via holes 80.

Firstly, as shown in FIG. 4A, in the flexible circuit structure with stretchability of the present invention, the flexible substrate 20 is attached on a supporting substrate 10 through the thermal release manner or the UV release manner. The material of the flexible substrate 20 includes polyimide (PI) or polydimethylsiloxane (PDMS). Then, the active element 70 (e.g., a chip) is disposed on the surface of the flexible substrate 20 in a direction facing the flexible substrate 20. Next, the first flexible material layer 51 is implanted on the active element 70 and the flexible substrate 20. In other words, the active element 70 is embedded in the first flexible material layer 51, and at least one via hole 80 is formed in the first flexible material layer 51, so as to extend the circuit from a contact of the active element 70 to the first flexible material layer 51. The material of the first flexible material layer 51 includes polyimide (PI) or polydimethylsiloxane (PDMS).

Then, a plurality of compressible flexible bumps 30 is deposited on the first flexible material layer 51 at predetermined positions for implanting the metal circuit, and the compressibility of the flexible bumps 30 is higher than that of the flexible substrate 20. The material of the flexible bumps 30 includes polyimide (PI), polydimethylsiloxane (PDMS), or polyurethane (PU). The flexible bumps 30 are in a substantially island-shaped structure, and persons skilled in the art can easily understand that the flexible bumps 30 can also be designed into triangular, semicircular, wave-shaped, or another geometrical shape. In addition, persons skilled in the art can readily understand that the flexible bumps 30 of the fourth embodiment can also be designed to have the same structure as the flexible bumps 31 of the third embodiment do.

Referring to FIG. 4B, after the flexible bumps 30 have been deposited, the metal circuit is implanted on the first flexible material layer 51 and the flexible bumps 30, so as to form the metal layer 40, which is used for transmitting signals. Next, referring to FIG. 4C, a layer of flexible material is covered or laminated onto the metal layer 40, so as to form the second flexible material layer 52, and thus, the stability of the flexible circuit structure is improved. Then, the supporting substrate 10 below the flexible substrate 20 is removed. The material of the second flexible material layer 52 includes polyimide (PI) or polydimethylsiloxane (PDMS).

Figure 5A:
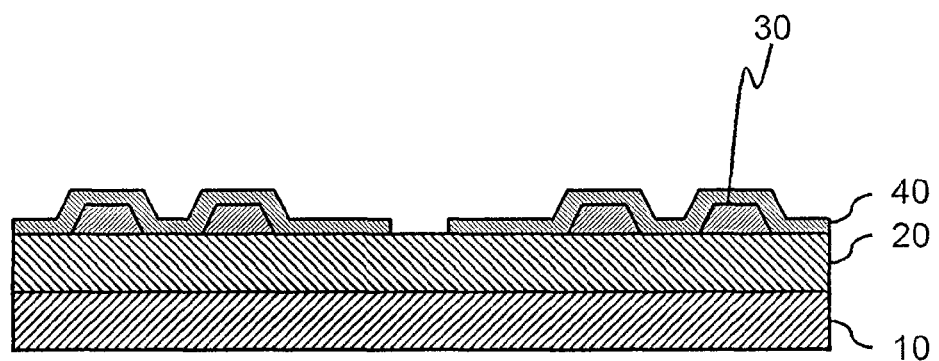
FIG. 5A is a schematic sectional view of a flexible circuit structure according to a fifth embodiment of the present invention.
Figure 5B:
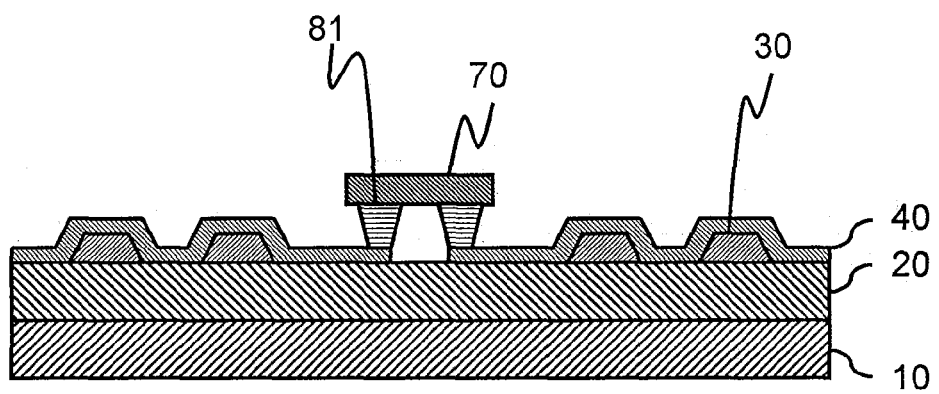
FIG. 5B is a schematic sectional view of the flexible circuit structure according to the fifth embodiment of the present invention.
Figure 5C:
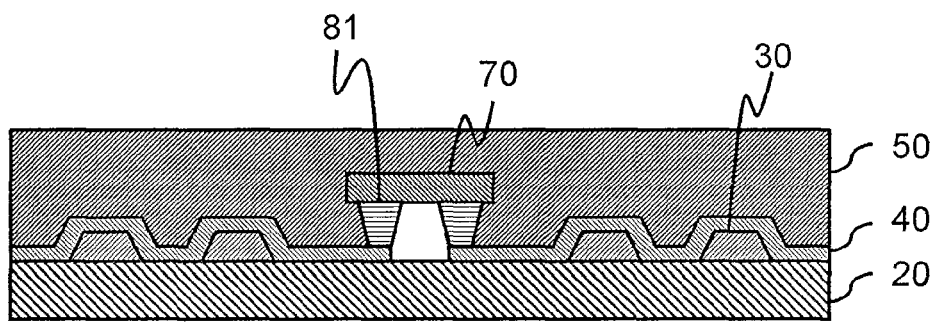
FIG. 5C is a schematic sectional view of the flexible circuit structure according to the fifth embodiment of the present invention.

FIGS. 5A, 5B, and 5C are respectively schematic sectional views of a flexible circuit structure according to a fifth embodiment of the present invention. As shown in FIG. 5C, the flexible circuit structure with stretchability of the present invention includes a flexible substrate 20, a plurality of flexible bumps 30, a metal layer 40, a flexible material layer 50, an active element 70, and pins 81.

Firstly, as shown in FIG. 5A, in the flexible circuit structure with stretchability of the present invention, the flexible substrate 20 is attached on a supporting substrate 10 through the thermal release manner or the UV release manner. The material of the flexible substrate 20 includes polyimide (PI) or polydimethylsiloxane (PDMS). Then, a plurality of compressible flexible bumps 30 is deposited on the flexible substrate 20 at predetermined positions for implanting the metal circuit, and the compressibility of the flexible bumps 30 is higher than that of the flexible substrate 20. The material of the flexible bumps 30 includes polyimide (PI), polydimethylsiloxane (PDMS), or polyurethane (PU). The flexible bumps 30 are in a substantially island-shaped structure, and persons skilled in the art can easily understand that the flexible bumps 30 can also be designed into triangular, semicircular, wave-shaped, or another geometrical shape. In addition, persons skilled in the art can readily understand that the flexible bumps 30 of the fifth embodiment can also be designed to have the same structure as the flexible bumps 31 of the third embodiment do.

After the flexible bumps 30 have been deposited, the metal circuit is implanted on the first flexible material layer 51 and the flexible bumps 30, so as to form the metal layer 40, which is used for transmitting signals. Referring to FIG. 5B, the active element 70 (e.g., a chip) is disposed above the metal layer 40, and the pins 81 are electrically coupled to the corresponding metal layer 40 respectively. Next, referring to FIG. 5C, the flexible material layer 50 is implanted on the active element 70 and the metal layer 40, so as to improve the stability of the flexible circuit structure. In other words, the active element 70 is embedded in the flexible material layer 50. The material of the flexible material layer 50 includes polyimide (PI) or polydimethylsiloxane (PDMS).

Figure 6A:
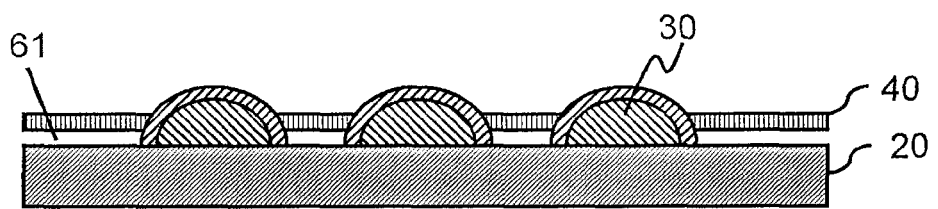
FIG. 6A is a schematic sectional view of a flexible circuit structure according to a sixth embodiment of the present invention.

FIG. 6A is a schematic sectional view of a flexible circuit structure according to a sixth embodiment of the present invention. The difference between the sixth embodiment and the second embodiment lies in that the buffer layer 60 is substituted by a sacrificial layer 61 in the sixth embodiment. After the metal layer 40 is implanted, the buffer layer 60 is removed, such that the metal layer 40 turns into a suspending configuration, and the suspending area is the sacrificial layer 61. In other words, the metal layer 40 between the flexible bumps 30 is in a suspending configuration. In the sixth embodiment, the flexible bumps 30 have a semicircular structure, and the structure of the rest parts is the same as that of the second embodiment, which thus is not described again here.

Figure 6B:
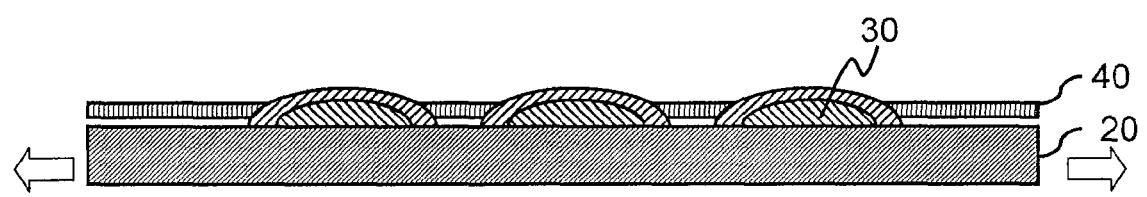
FIG. 6B is a schematic view of the flexible circuit structure that is deformed under an external force according to the sixth embodiment of the present invention.

FIG. 6B is a schematic view of the flexible circuit structure that is deformed under an external force according to the sixth embodiment of the present invention. When a horizontal external force is applied on the flexible substrate 20, the force is mostly absorbed by the semicircular flexible bumps 30. Accordingly, the flexible bumps 30 is deformed under the external force, which enhances the stretchability of the metal layer 40, and reduces the possibility that the metal layer 40 is broken due to the external force.

Figure 7:
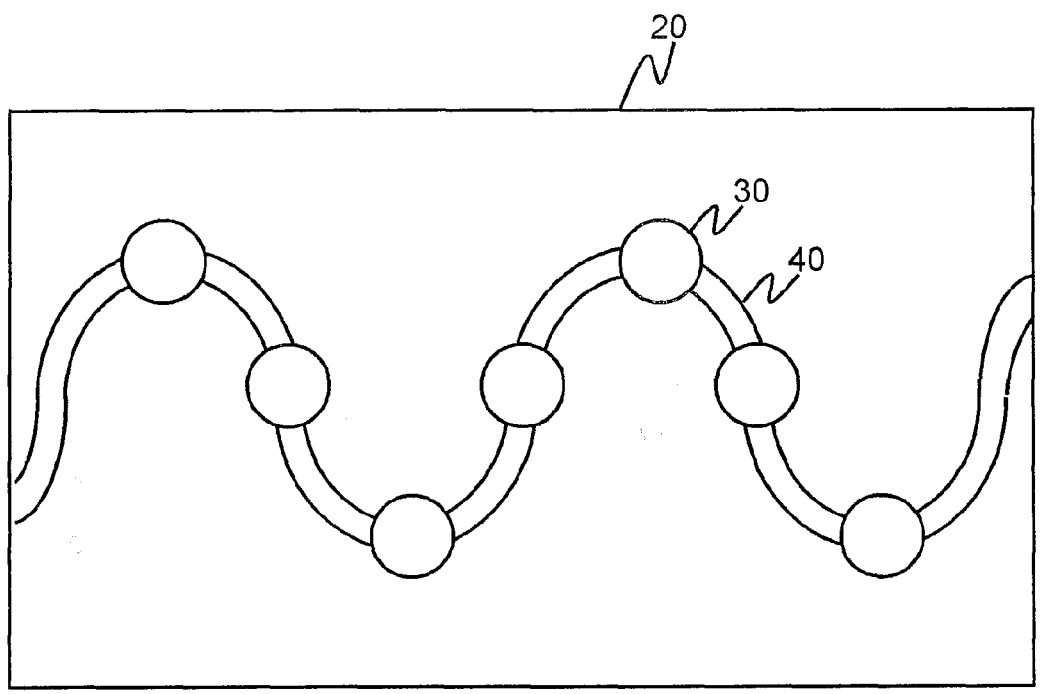
FIG. 7 is a schematic top view of a flexible circuit according to a seventh embodiment of the present invention.

FIG. 7 is a schematic top view of a flexible circuit according to a seventh embodiment of the present invention. As shown in FIG. 7, the metal layer 40 on the flexible substrate 20 is in a wave-shaped structure in the seventh embodiment. A plurality of flexible bumps 30 is formed on the twist-and-turn path of the metal layer 40, and every two flexible bumps 30 are spaced apart by a predetermined distance. As shown in FIG. 7, the plurality of flexible bumps 30 are disposed on inflection points of the metal layer 40, respectively. Owing that the inflection points are stress concentration areas of the metal layer 40, the flexible bumps 30 disposed on the inflection points absorb the external force and prevent the metal layer 40 from being broken. The difference between the seventh embodiment and the first embodiment lies in that, in the seventh embodiment, the metal layer 40 is firstly formed on the flexible substrate 20, and then, the flexible bumps are deposited on the metal layer 40. The materials of the rest parts are the same as those in the first embodiment, which thus will not be described again here.

Figure 8:
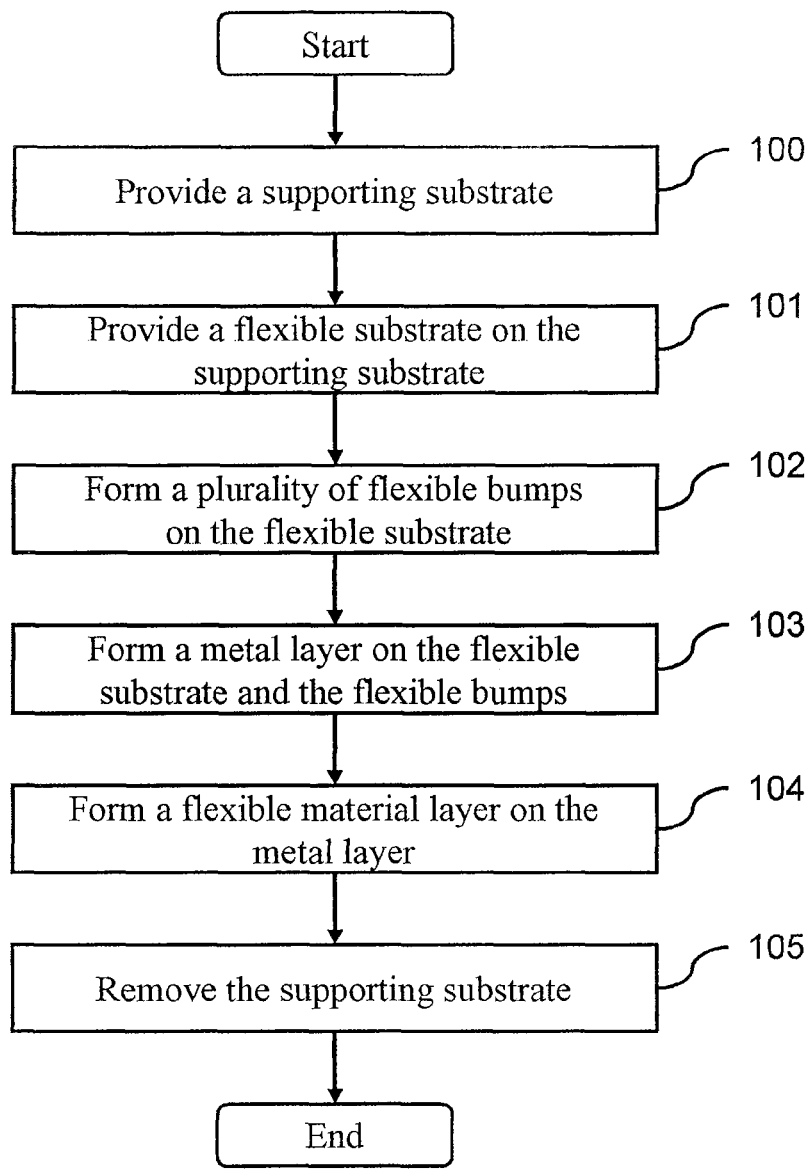
FIG. 8 is a flow chart of a method of manufacturing the flexible circuit according to the first embodiment of the present invention.

FIG. 8 is a flow chart of a method of manufacturing the flexible circuit according to the first embodiment of the present invention. As shown in FIG. 8, the method of manufacturing the flexible circuit with stretchability of the present invention includes the following steps.

Firstly, a supporting substrate is provided (Step 100). Then, a flexible substrate is provided on the supporting substrate (Step 101). The material of the flexible substrate includes polyimide (PI) or polydimethylsiloxane (PDMS), and the flexible substrate is attached on the supporting substrate through the thermal release manner or the UV release manner.

Next, a plurality of flexible bumps is formed on the flexible substrate (Step 102). The material of the flexible bumps includes polyimide (PI) or polydimethylsiloxane (PDMS), and the flexible bumps are deposited on the flexible substrate. The flexible bumps can be in independent structures, or be interconnected to an integrated structure.

Then, a metal layer is formed on the flexible substrate and the flexible bumps (Step 103). The material of the metal layer can be, for example, conductive materials such as Au, Ag, or Cu, and the metal layer is formed on the flexible substrate and the flexible bumps by means of implantation, which is used for transmitting signals.

Then, a flexible material layer is formed on the metal layer (Step 104). The material of the flexible material layer includes polyimide (PI) or polydimethylsiloxane (PDMS), and the flexible material layer is formed on the metal layer by means of covering or laminating, so as to improve the stability of the flexible circuit structure. Finally, the supporting substrate below the flexible substrate is removed (Step 105). In addition, persons skilled in the art can readily understand that, the sequence of Step 104 and Step 105 can be exchanged, i.e., it still falls into the scope of the present invention that the flexible material is formed on the metal layer after the supporting substrate has been removed.

Figure 9:
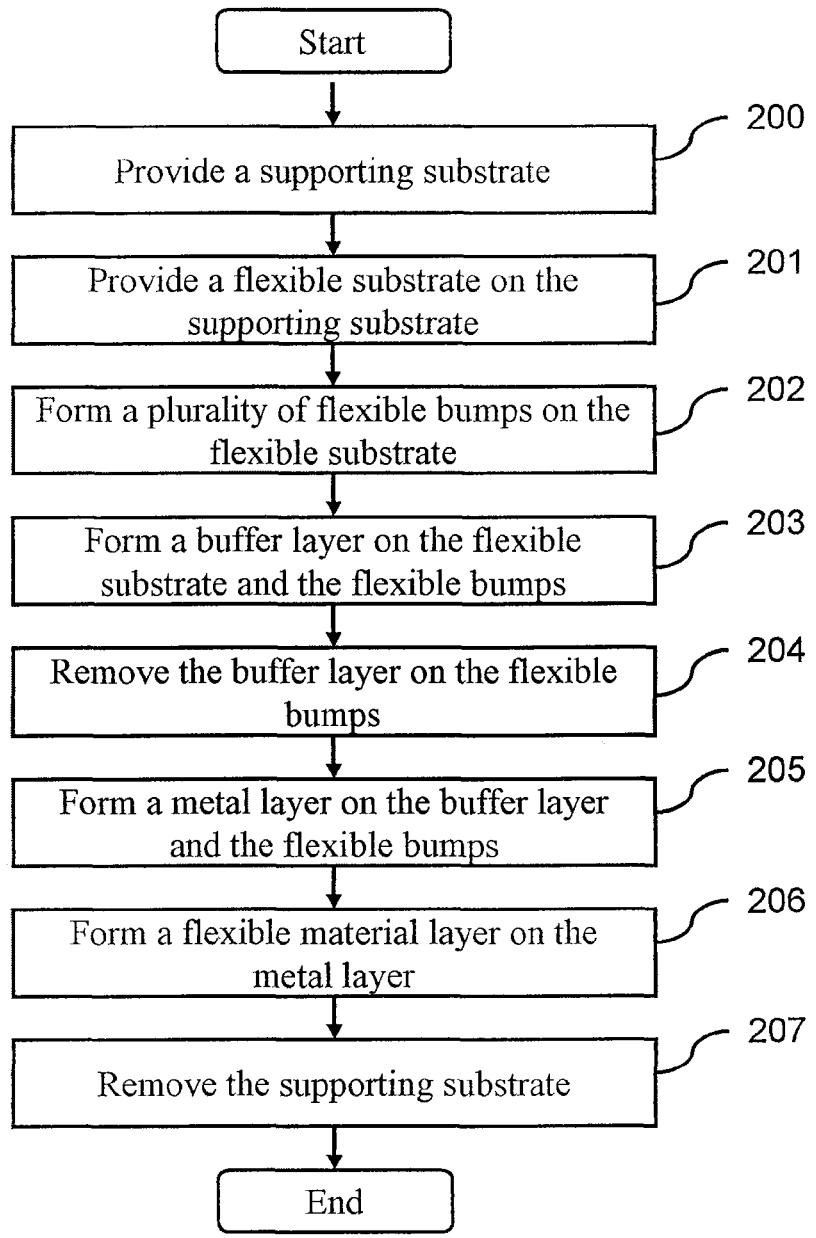
FIG. 9 is a flow chart of a method of manufacturing the flexible circuit according to the second embodiment of the present invention.

FIG. 9 is a flow chart of a method of manufacturing the flexible circuit according to the second embodiment of the present invention. As shown in FIG. 9, the method of manufacturing the flexible circuit with stretchability of the present invention includes the following steps.

Firstly, a supporting substrate is provided (Step 200). Then, a flexible substrate is provided on the supporting substrate (Step 201). The material of the flexible substrate includes polyimide (PI) or polydimethylsiloxane (PDMS), and the flexible substrate is attached on the supporting substrate through the thermal release manner or the UV release manner.

Next, a plurality of flexible bumps is formed on the flexible substrate (Step 202). The material of the flexible bumps includes polyimide (PI) or polydimethylsiloxane (PDMS), and the flexible bumps are deposited on the flexible substrate. The flexible bumps can be in independent structures, or be interconnected to an integrated structure.

Then, a buffer layer is formed on the flexible substrate and the flexible bumps (Step 203). The buffer layer has a low adherence, and is formed on the flexible substrate and the flexible bumps by coating, so as to bear the external stresses between the flexible substrate and a metal layer. Next, the buffer layer above each flexible bump is removed (Step 204).

Then, the metal layer is formed on the buffer layer and the flexible bumps (Step 205). The material of the metal layer can be, for example, conductive materials such as Au, Ag, or Cu. The metal layer is formed on the flexible substrate and the flexible bumps by means of implantation, which is used for transmitting signals.

Then, a flexible material layer is formed on the metal layer (Step 206). The material of the flexible material layer includes polyimide (PI) or polydimethylsiloxane (PDMS), and the flexible material layer is formed on the metal layer by means of covering or laminating, so as to improve the stability of the flexible circuit structure. Finally, the supporting substrate below the flexible substrate is removed (Step 207). In addition, persons skilled in the art can readily understand that, the sequence of Step 206 and Step 207 can be exchanged, i.e., it still falls into the scope of the present invention that the flexible material layer is formed on the metal layer after the supporting substrate is removed.

Figure 10:
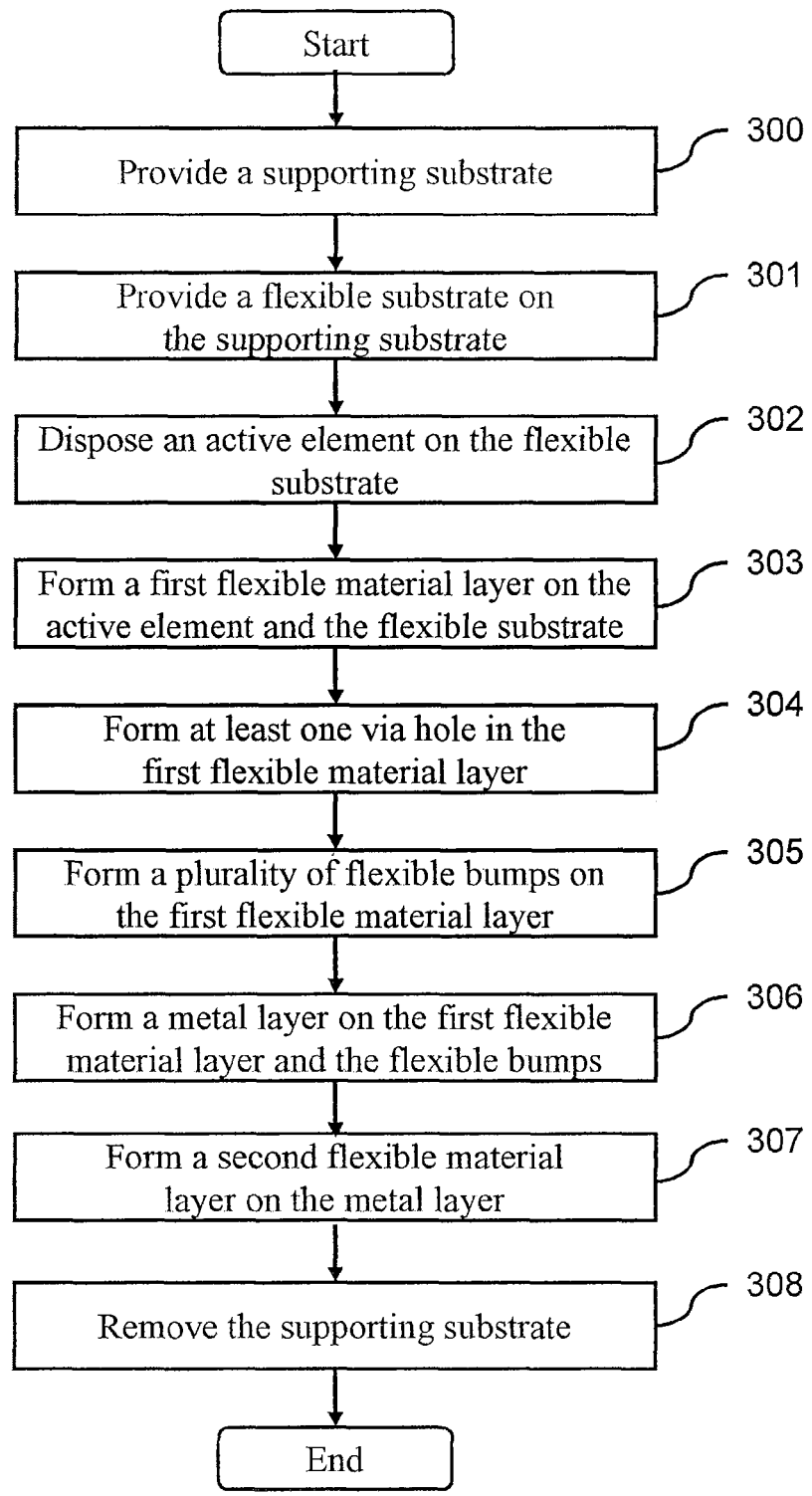
FIG. 10 is a flow chart of a method of manufacturing the flexible circuit according to the fourth embodiment of the present invention.

FIG. 10 is a flow chart of a method of manufacturing the flexible circuit according to the fourth embodiment of the present invention. As shown in FIG. 10, the method of manufacturing the flexible circuit with stretchability of the present invention includes the following steps.

Firstly, a supporting substrate is provided (Step 300). Then, a flexible substrate is provided on the supporting substrate (Step 301). The material of the flexible substrate includes polyimide (PI) or polydimethylsiloxane (PDMS), and the flexible substrate is attached on the supporting substrate through the thermal release manner or the UV release manner.

Next, an active element (e.g., a chip) is disposed on the flexible substrate (Step 302). Then, a first flexible material layer is formed on the active element and the flexible substrate (Step 303). The material of the first flexible material layer includes polyimide (PI) or polydimethylsiloxane (PDMS).

Then, at least one via hole is formed in the first flexible material layer (Step 304), so as to extend the circuit from a contact of the active element to the first flexible material layer. Then, a plurality of flexible bumps is formed on the first flexible material layer (Step 305). The material of the flexible bumps includes polyimide (PI) or polydimethylsiloxane (PDMS), and the flexible bumps are deposited on the flexible substrate. The flexible bumps can be in independent structures, or be interconnected to an integrated structure.

Then, a metal layer is formed on the first flexible material layer and the flexible bumps (Step 306). The material of the metal layer can be, for example, conductive materials such as Au, Ag, or Cu, and the metal layer is formed on the flexible substrate and the flexible bumps by means of implantation, which is used for transmitting signals.

Then, a second flexible material layer is formed on the metal layer (Step 307). The material of the second flexible material layer includes polyimide (PI) or polydimethylsiloxane (PDMS), and the second flexible material layer is formed on the metal layer by means of covering or laminating, so as to improve the stability of the flexible circuit structure. Finally, the supporting substrate below the flexible substrate is removed (Step 308). In addition, persons skilled in the art can readily understand that the sequence of Step 307 and Step 308 can be exchanged, i.e., it still falls into the scope of the present invention that the second flexible material layer is formed on the metal layer after the supporting substrate is removed.

Figure 11:
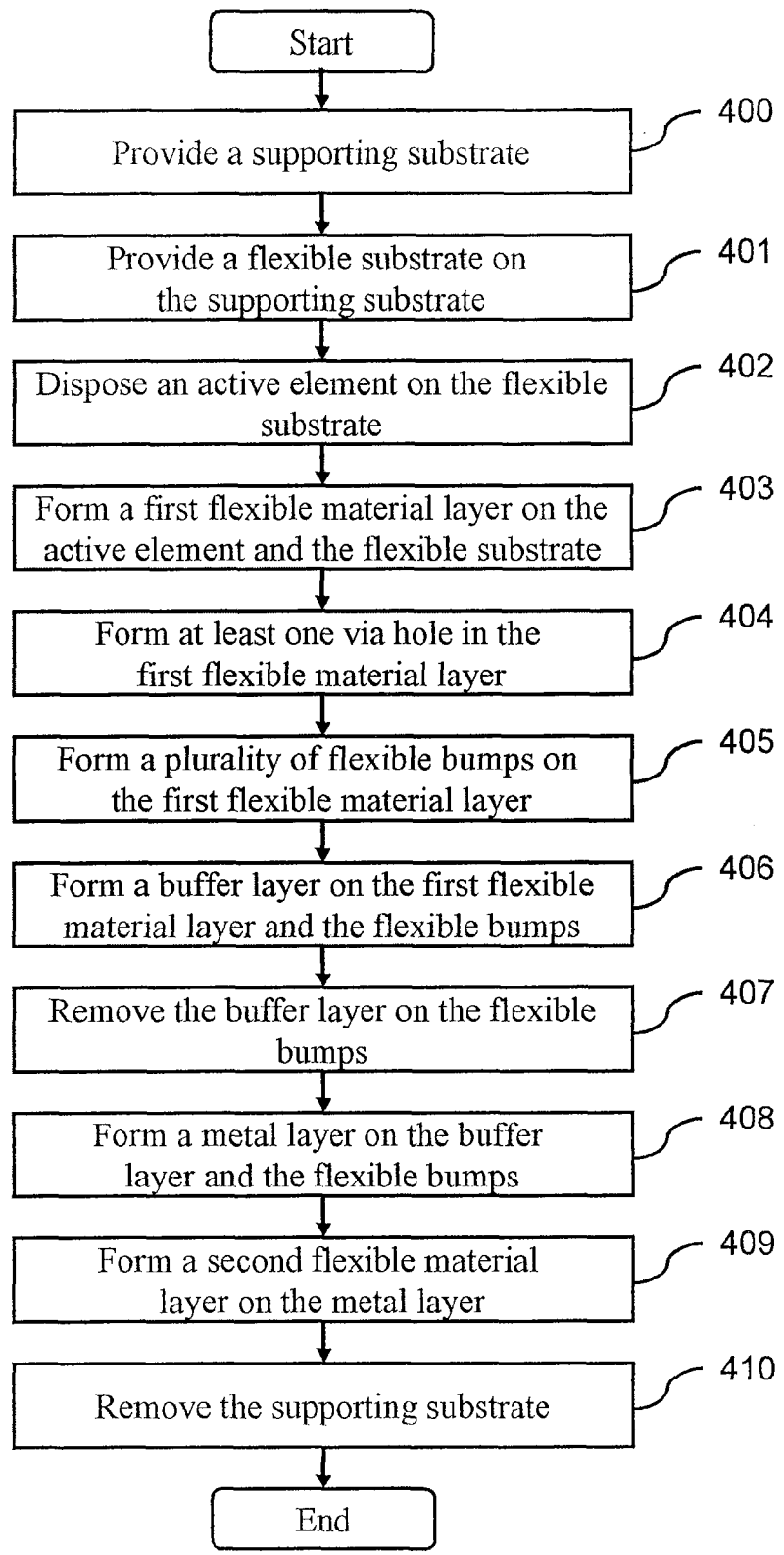
FIG. 11 is a flow chart of a method of manufacturing the flexible circuit according to the eighth embodiment of the present invention.

FIG. 11 is a flow chart of a method of manufacturing the flexible circuit according to the eighth embodiment of the present invention. As shown in FIG. 11, the method of manufacturing the flexible circuit with stretchability of the present invention includes the following steps.

Firstly, a supporting substrate is provided (Step 400). Then, a flexible substrate is provided on the supporting substrate (Step 401). The material of the flexible substrate includes polyimide (PI) or polydimethylsiloxane (PDMS), and the flexible substrate is attached on the supporting substrate through the thermal release manner or the UV release manner.

Next, an active element (e.g., a chip) is disposed on the flexible substrate (Step 402). Then, a first flexible material layer is formed on the active element and the flexible substrate (Step 403). The material of the first flexible material layer includes polyimide (PI) or polydimethylsiloxane (PDMS).

Then, at least one via hole is formed in the first flexible material layer (Step 404), so as to extend the circuit from a contact of the active element to the first flexible material layer. Then, a plurality of flexible bumps is formed on the first flexible material layer (Step 405). The material of the flexible bumps includes polyimide (PI) or polydimethylsiloxane (PDMS), and the flexible bumps are deposited on the flexible substrate. The flexible bumps can be in independent structures, or be interconnected to an integrated structure.

Then, a buffer layer is formed on the first flexible material layer and the flexible bumps (Step 406). The buffer layer has a low adherence, and is formed on the first flexible material layer and the flexible bumps by means of coating, so as to bear the external stresses between the flexible substrate and a metal layer. Then, the buffer layer above each flexible bump is removed (Step 407).

Then, the metal layer is formed on the buffer layer and the flexible bumps (Step 408). The material of the metal layer can be, for example, conductive materials such as Au, Ag, or Cu, and the metal layer is formed on the buffer layer and the flexible bumps by means of implantation, which is used for transmitting signals.

Then, a second flexible material layer is formed on the metal layer (Step 409). The material of the second flexible material layer includes polyimide (PI) or polydimethylsiloxane (PDMS), and the second flexible material layer is formed on the metal layer by means of covering or laminating, so as to improve the stability of the flexible circuit structure. Finally, the supporting substrate below the flexible substrate is removed (Step 410). In addition, persons skilled in the art can readily understand that, the sequence of Step 409 and Step 410 can be exchanged, i.e., it still falls into the scope of the present invention that the second flexible material layer is formed on the metal layer after the supporting substrate is removed.

To sum up, according to the flexible circuit structure with stretchability of the present invention and the method of manufacturing the same, a plurality of flexible bumps is formed on the flexible substrate, and then, the designed circuit is formed on the flexible substrate and the flexible bumps. Once the flexible substrate is deformed under an external force, the flexible bumps on the flexible substrate are compressed accordingly in the vertical direction, so as to provide a deformation of the flexible substrate in the horizontal direction. Therefore, the circuit on the flexible bumps has gradually changed from a 3D circuit into the one on the same plane, but the break circuit will not occur though there is an external stretch. Thus, the flexible circuit has better stretchability, and the flexible circuit can be manufactured more conveniently by means of circuit implantation.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A flexible circuit structure with stretchability, comprising:
    a flexible substrate;
    a metal layer, formed on the flexible substrate; and
    a plurality of flexible bumps, formed on the metal layer and the flexible substrate, wherein;
    the flexible bumps have a compressibility that is larger than a compressibility of the flexible substrate,
    the plurality of flexible bumps are spaced apart from one another, and
    the metal layer has a wave-shaped structure and include inflection points, wherein the flexible bumps are disposed on the inflection points.

2. The flexible circuit structure with stretchability as claimed in claim 1, wherein a material of the flexible substrate includes polyimide (PI) or polydimethylsiloxane (PDMS).

3. The flexible circuit structure with stretchability as claimed in claim 1, wherein a material of the flexible material layer includes polyimide (PI) or polydimethylsiloxane (PDMS).

4. The flexible circuit structure with stretchability as claimed in claim 1, wherein a material of the flexible bumps includes polyimide (PI), polydimethylsiloxane (PDMS), or polyurethane (PU).

* * * * *